United States Patent
Liu et al.

(10) Patent No.: US 9,508,610 B2
(45) Date of Patent: Nov. 29, 2016

(54) INLINE MEASUREMENT OF MOLDING MATERIAL THICKNESS USING TERAHERTZ REFLECTANCE

(71) Applicant: INTEL CORPORATION, Santa Clara, CA (US)

(72) Inventors: Shuhong Liu, Chandler, AZ (US); Nilanjan Z. Ghosh, Chandler, AZ (US); Zhiyong Wang, Chandler, AZ (US); Deepak Goyal, Phoenix, AZ (US); Shripad Gokhale, Gilbert, AZ (US); Jieping Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 14/499,120

(22) Filed: Sep. 27, 2014

(65) Prior Publication Data
US 2016/0093540 A1    Mar. 31, 2016

(51) Int. Cl.
*H01L 21/66* (2006.01)
*G01B 11/06* (2006.01)
*H01L 23/31* (2006.01)
*H01L 23/00* (2006.01)

(52) U.S. Cl.
CPC .............. *H01L 22/12* (2013.01); *G01B 11/06* (2013.01); *H01L 23/3128* (2013.01); *H01L 24/97* (2013.01); *H01L 24/16* (2013.01); *H01L 2224/16227* (2013.01); *H01L 2224/97* (2013.01); *H01L 2924/15331* (2013.01); *H01L 2924/1815* (2013.01); *H01L 2924/37001* (2013.01)

(58) Field of Classification Search
CPC ... H01L 22/12; H01L 24/97; H01L 23/3128; H01L 2924/37001; H01L 2924/1815; H01L 2224/16227; H01L 24/16; H01L 2924/15331; H01L 2224/97; G01B 11/06
See application file for complete search history.

(56) References Cited

U.S. PATENT DOCUMENTS

| | | | |
|---|---|---|---|
| 7,876,423 B1* | 1/2011 | Roth | G01B 11/0625 356/27 |
| 2002/0009584 A1* | 1/2002 | Boyer | B29C 44/1266 428/315.5 |
| 2006/0186483 A1* | 8/2006 | Cho | G11C 13/0004 257/390 |
| 2010/0148070 A1* | 6/2010 | Ho | G01N 21/3581 250/341.8 |

* cited by examiner

*Primary Examiner* — John P Dulka
(74) *Attorney, Agent, or Firm* — Blakely, Sokoloff, Taylor & Zafman LLP

(57) ABSTRACT

A method including emitting a terahertz beam from a light source at a layer of molding material; detecting a reflectance of the beam; and determining a thickness of the layer of molding material. A system including a panel supporter operable to support a panel including a plurality of substrates arranged in a planar array; a light source operable to emit a terahertz beam at a panel on the panel supporter; a detector operable to detect a reflection of a terahertz beam emitted at a panel; and a processor operable to determine a thickness of a material on the panel based on a time delay for an emitted terahertz beam to be detected by the detector.

15 Claims, 5 Drawing Sheets

INLINE MEASUREMENT OF MOLDING MATERIAL THICKNESS USING TERAHERTZ REFLECTANCE

BACKGROUND

Field

Integrated circuit packaging.

Description of Related Art

Accurately measuring molding material thickness associated with integrated circuit die packaging is a valuable tool for process control and monitoring during assembly technology development and manufacturing. Out-of-specification molding thickness can potentially lead to downstream low yield and reliability issues. As an example, yield loss is observed during surface mount technology (SMT) processes due to high warpage variation of a die relative to a package such as with a system on chip (SOC) package. Key contributors for high warpage variation in an SOC package is the molding thickness variation. Developing non-destructive measurement solutions for molding thickness is inherently challenging due to its low-transparency nature in visible and infrared (IR) wavelength and the relatively large thickness of the molding material. Existing inline inspection metrologies based on optical or X-ray do not have the capability to inspect the molding material due to high beam absorption or low contrast. Acoustic microscopy requires parts to be immersed in water thus not suited for inline monitoring. One method available to measure molding thickness is physical failure analysis (FA) cross-section which is destructive and low-throughput and thus not amenable to inline process monitoring.

DETAILED DESCRIPTION

A high throughput and low cost metrology based on terahertz reflectance that may be used for non-destructive, non-contact in-line monitoring of non-conductive material thickness on a structure such as package molding material thickness on a die(s) is described. Terahertz wave reflectance measurement offers the property of transmitting through a non-conductive material such as molding material and reflecting at the interface between molding material and, for example, a silicon die. Molding thickness can be obtained from a time delay between reflected lights from a top and a bottom of a material layer such as a molding material layer.

Figure 1:
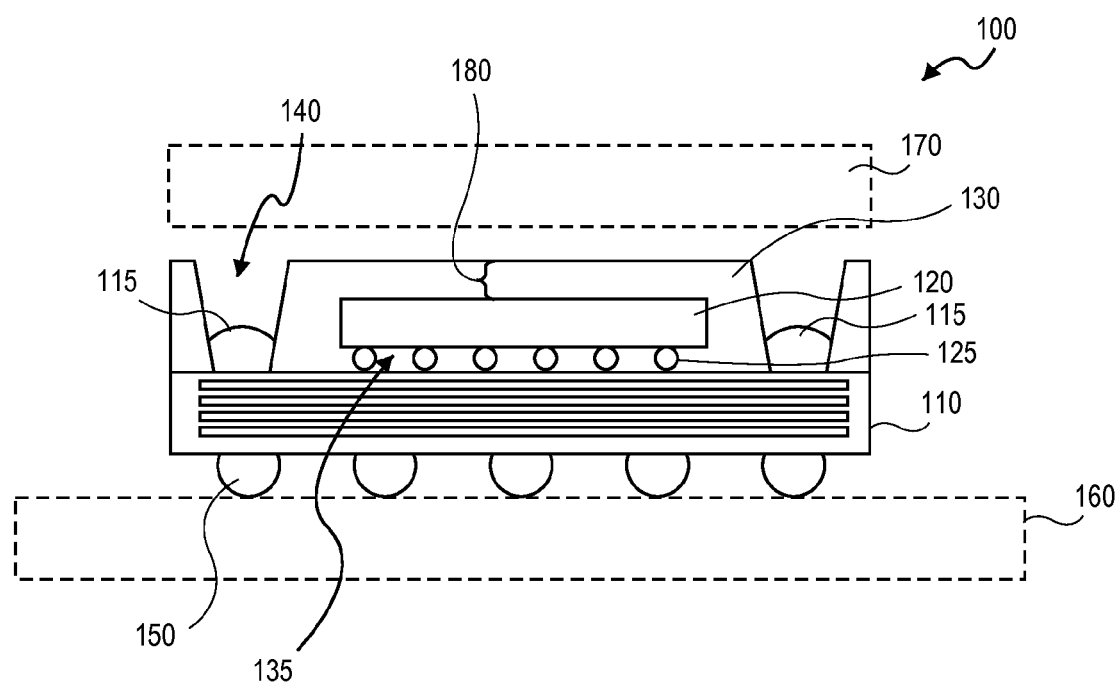
FIG. 1 shows a cross-sectional schematic side view of an embodiment of an intergrated circuit package.

FIG. 1 shows a cross-sectional side view of an integrated circuit package. Package 100 includes substrate 110 and die 120 such as a microprocessor (e.g., central processing unit) attached thereto. In one embodiment, package 100 is a system on chip (SOC) package including through molding interconnects to connect the package to an auxiliary device or devices such as a memory device or devices. In one embodiment of forming such a package, top side solder material 115 is connected to substrate 110 as is die 120 (through solder connections 125). Next, molding material 130 of a non-conductive material such as an organic resin optionally containing fillers (e.g. silica fillers) is dispensed on die 120 and a die side of substrate 110 (top surface as viewed). The molding material is also dispensed into first level interconnect (FLI) die gap 135 between substrate 110 and die 120. As illustrated in FIG. 1, in one embodiment, molding material 130 encapsulates die 120 such that die 120 is embedded in molding material 130 (molding material is disposed on the lateral sidewalls and a top surface of die 120 as viewed).

Following the dispensing of molding material 130 on die 120 and a die side of substrate 110, through molding vias (TMVs) 140 are formed. One way of forming TMVs 140 is by laser drilling. After the formation of TMVs 140, package 100 may be singulated from a panel of multiple similar structures. Following singulation from the panel, second level interconnect (SLI) solder connections 150 are connected to a backside of substrate 110 (a side opposite die side). Package 100 may then be mounted on board 160 such as a motherboard through SLI connections 150. One or more memory packages such as memory package 170 may then be attached to package 100 through throughg molding interconnects to TMVs 140.

As noted above, molding material 130, in one embodiment, encapsulates die 120. In one embodiment, it is desired to measure a thickness of the molding material on die 120 (indicated by thickness measurement 180) as molding thickness is a key modulator for a warpage of package 110 and thus, can have a significant impact on downstream surface mount technology (SMT) process.

As described above, in one embodiment, terahertz reflectance is used for molding thickness measurement. Terahertz light consists of electromagnetic waves with wavelengths ranging from 1 mm to 0.1 mm, corresponding to frequencies from 0.3 to 3 terahertz. In this band range, it is known that light can penetrate non-conducting materials such as paper, cloth, and plastic, but cannot penetrate metal and water. Molding material used to encapsulate and embed a die in package substrates generally consists of organic resins and silica fillers which each both non-conducting and therefore can transmit terahertz light.

Figure 2A:
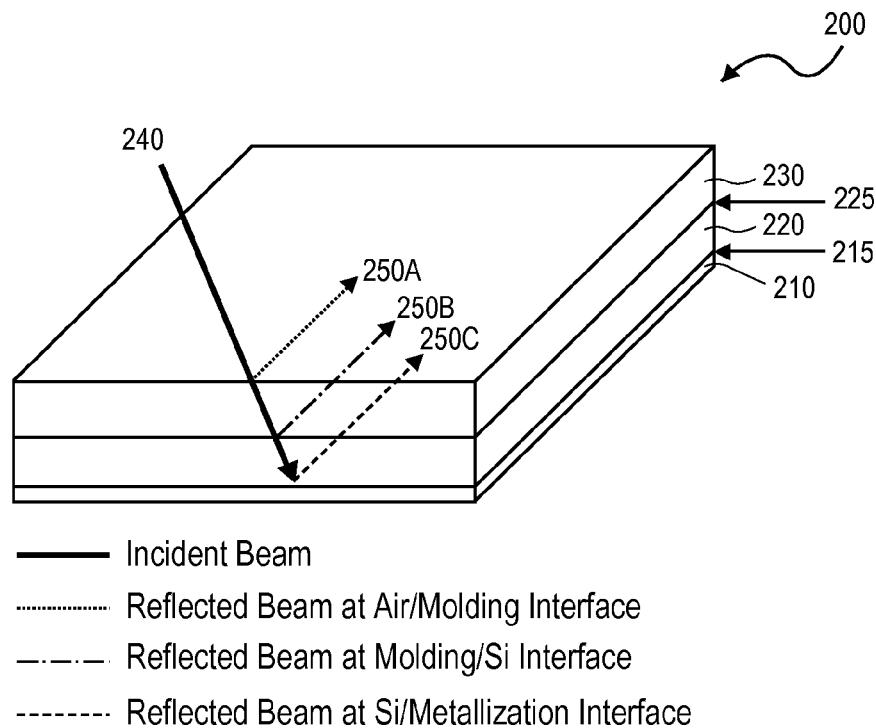
FIG. 2A shows a schematic of a terahertz beam emitted at a multilayer substrate and its corresponding reflectance.
Figure 2B:
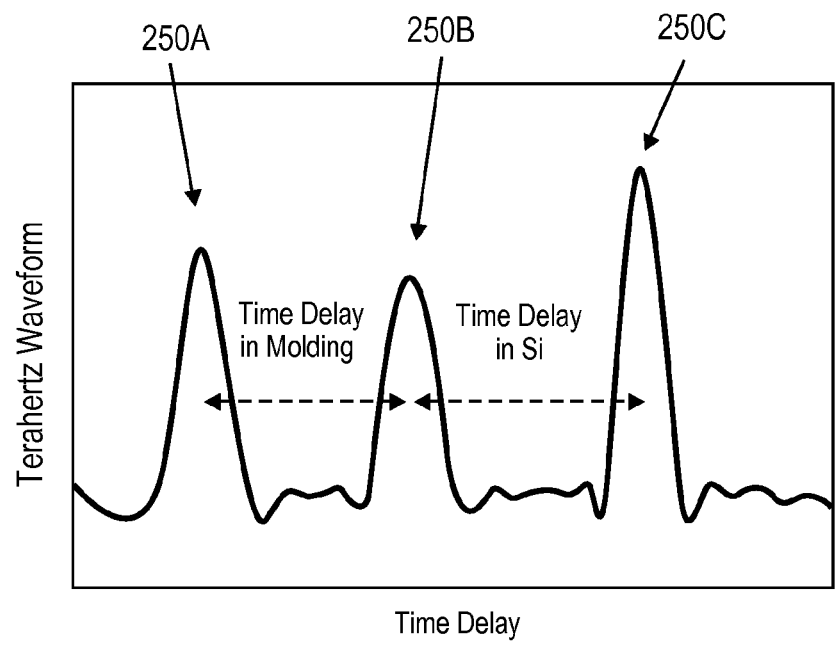
FIG. 2B shows a graph of a terahertz waveform versus a time delay for the emitted beam in FIG. 2A.

FIG. 2A shows a schematic of a beam emitted at a multilayer substrate and its corresponding terahertz reflectance. FIG. 2A shows a top side perspective view of a substrate (substrate 200) including metal layer 210, silicon layer 220 on metal layer 210 and molding material layer 230 on silicon layer 220. When a terahertz beam (beam 240) is emitted from a light source at substrate 200, a portion of the incident beam is reflected at the air/molding interface (portion 250A), while the rest of the beam continues to pass through molding material layer 250 and silicon layer 220 and is reflected at the molding/Si interface 225 (portion 250B) and later at the Si/metallization interface 215 (portion 250C). A light detector can identify the waveforms of reflected beams between two interfaces with a time delay, which is due to light traveling in molding material layer 230 or in silicon layer 220 as illustrated in FIG. 2B. A thickness of molding material layer 230 can be calculated from the time delay and refractive index based on the following formula:

$$\text{Molding thickness} = \text{Time Delay} \times \frac{\text{Speed of Light in Vacuum}}{\text{Refractive Index of molding material}}.$$

Figure 3:
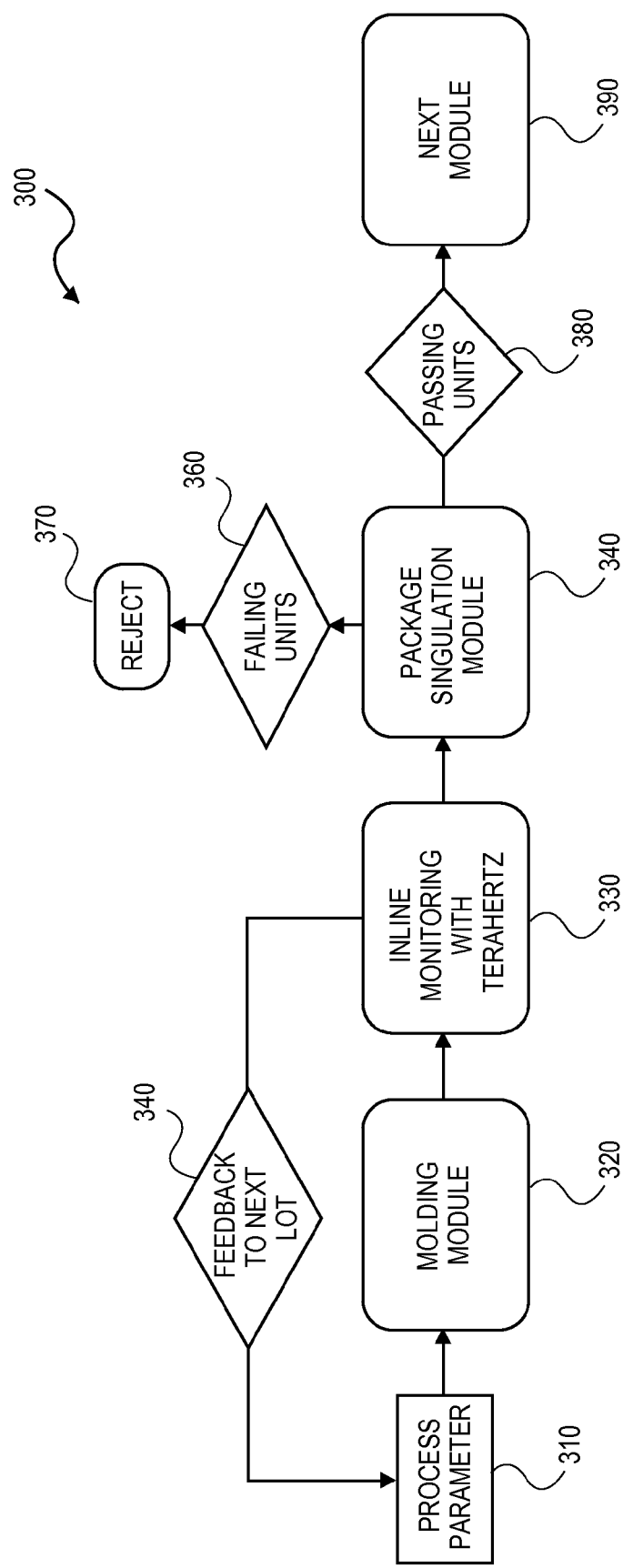
FIG. 3 shows a flow chart of a packaging process incorporating a module of inline monitoring with terahertz.
Figure 4:
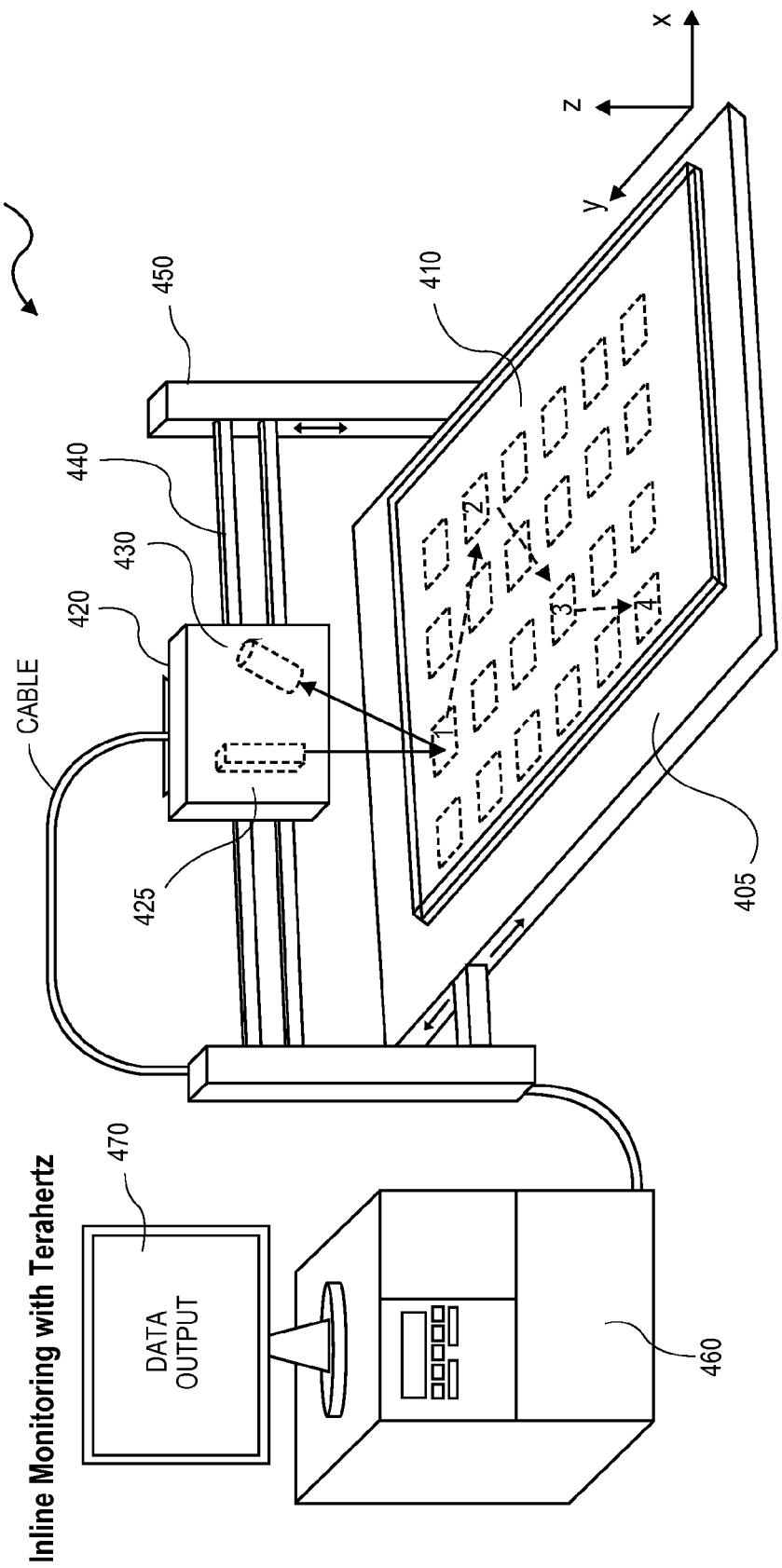
FIG. 4 shows a top perspective schematic view of a packaging process system incorporating a module of inline monitoring with terahertz.

FIG. 3 describes an embodiment of a packaging process flow by incorporating a module of inline monitoring with terahertz. FIG. 4 shows a top perspective schematic view of a packaging process system incorporating a module of inline monitoring with terahertz. The system of FIG. 4 may be used to implement process 300 of FIG. 3. Referring to FIG. 4, inline monitoring system 400 includes panel supporter 405 operable to support substrate panel 410 including, in one embodiment, a number of package substrates onto each of which a die is attached. Terahertz optical system 420 including light source 425 and detector 430 is mounted above panel supporter 405 by support arms 440 and is operable to be translated on support arms 440 in an x-direction. Support arms 440 are connected on opposite sides of panel supporter 405 to posts 450. Posts 450 are operable to be translated in a y-direction. In this manner, optical system 420 is operable to be moved in an x-direction (by support arms 440) and a y-direction (by posts 450) to position light source 425 and detector 430 over a predetermined or desired substrate of a panel of such substrates (e.g., any of substrates 1, 2, 3, or 4). In another embodiment, support arms 440 are operable to be translated in a z-direction on posts 450 such that a position of light source 425 and/or detector 430 relative to substrate panel 410 may be modified. System 450 also includes controller 460 including non-transitory machine readable instructions operable to control an XYZ position of optical system 420 such that film or layer thickness of individual substrate panels can be measured.

Referring to FIG. 3, one embodiment of a process or method is embodied in process flow 300. In this embodiment, the process or method dispenses a molding material on a die on a substrate, such as a die on a substrate of substrate panel 410 (see FIG. 4) and then measures a thickness of such material. First, a process parameter for a predetermined target thickness of molding material is established and for example set in process 460, FIG. 4 (block 310). Next, a molding material is dispensed on one or more, including all, substrates of substrate panel 410, FIG. 4 (block 320). One method for dispensing a molding material of an organic resin is to pour a liquid form of the resin onto the substrate panel to the target thickness and allow the resin to harden (so-lidify).

Once the molding material is dispensed and hardened on a die, process flow 300 monitors a thickness of the molding material on the die (block 330). As described above, in one embodiment, such monitoring is accomplished by emitting a terahertz light from light source 425 at the molding material on the die, detecting a reflectance of the emitted light at detector 430 and determining a time delay of the emitted light. Some or all of this information may be transmitted to or retrieved by processor 460. Processor 460 includes non-transitory machine-readable instructions to, in one embodiment, determine the time delay and a thickness of the molding material. Information of the determined thickness of the molding material may be supplied through a feedback loop to process parameter block 310 such that the process parameter of molding material thickness may be adjusted (increased/decreased) if necessary (block 340).

Following the monitoring of a thickness of the molding material, substrate panel 410 is singulated into individual packages (block 350). A determination is made at that point or at the inline monitoring block whether a thickness of the molding material is sufficient to, for example, minimize warpage variation. If a thickness is either too small or too large, the unit is determined a failure (block 360) and rejected (block 370). If the thickness of the molding material meets a predetermined target thickness, the substrate passes (block 380) and is moved to a subsequent module for further package processing (block 390). The rejection/acceptance, in one embodiment, is determined by instructions in processor 460 based on an inputted predetermined target thickness.

Data is then about the processing of substrates including about inline monitoring and molding material thickness may be collected and processed and sent to output monitor 470 of FIG. 4. As shown in the process flow, inline monitoring can provide direct feedback to the molding process so that process parameters can be adjusted for the next lot to proactively prevent yield loss. Inline monitoring can also provide unit level data so that failing units can be immediately rejected after package singulation and do not need to be processed until end-of-line. Significant yield improvement and cost reduction can be achieved by incorporating the inline monitoring module.

Figure 5:
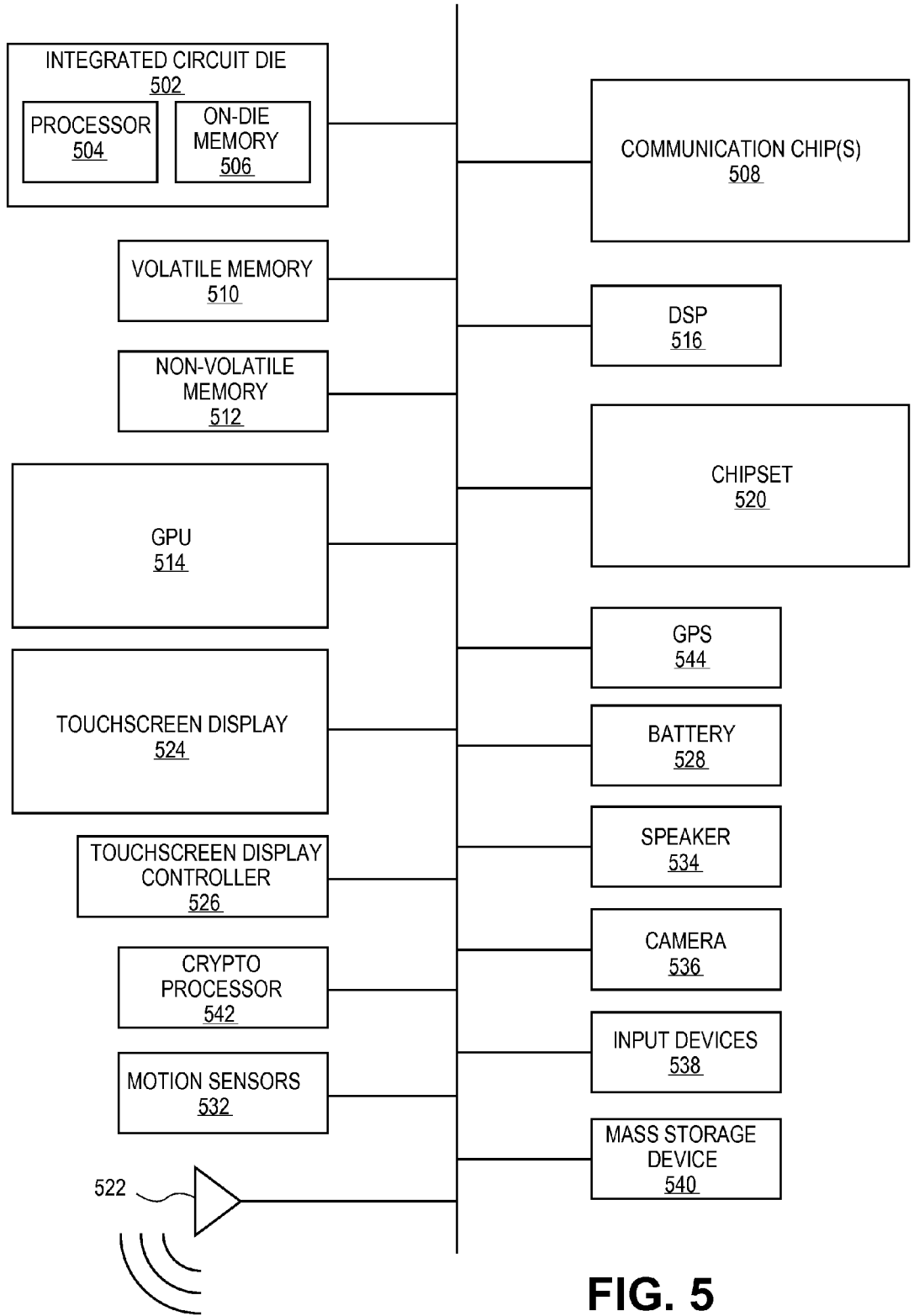
FIG. 5 illustrates an embodiment of a computing device.

FIG. 5 illustrates computing device 500 in accordance with one embodiment. Computing device 500 may include a number of components. In one embodiment, these components are attached to one or more motherboards. In an alternate embodiment, these components are fabricated onto a single system-on-a-chip (SoC) die rather than a motherboard. The components in computing device 500 include, but are not limited to, integrated circuit die 502 and at least one communication chip 508. In some implementations communication chip 508 is fabricated as part of integrated circuit die 502. Integrated circuit die 502 may include CPU 504 as well as on-die memory 506, often used as cache memory, that can be provided by technologies such as embedded DRAM (eDRAM) or spin-transfer torque memory (STTM or STTM-RAM). Such die may be encapsulated by a molding material.

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), graphics processing unit 514 (GPU), digital signal processor 516, crypto processor 542 (a specialized processor that executes cryptographic algorithms within hardware), chipset 520, antenna 522, a display or touchscreen display 524, touchscreen controller 526, battery 528 or other power source, a power amplifier (not shown), global positioning system (GPS) device 544, compass 530, motion coprocessor or sensors 532 (that may include an accelerometer, a gyroscope, and a compass), speaker 534, camera 536, user input devices 538 (such as a keyboard, mouse, stylus, and touchpad), and mass storage device 540 (such as hard disk drive, compact disk (CD), digital versatile disk (DVD), and so forth).

Communications chip 508 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 508. For instance, first communication chip 508 may be dedicated to shorter range wireless communications such as Wi-Fi and Bluetooth and second communication chip 508 may be dedicated to longer range wireless communications such as GPS, EDGE, GPRS, CDMA, WiMAX, LTE, Ev-DO, and others.

In various embodiments, computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

EXAMPLES

Example 1 is a method including emitting a terahertz beam from a light source at a layer of molding material; detecting a reflectance of the beam; and determining a thickness of the layer of molding material.

In Example 2, determining a thickness of the layer of molding material in the method of Example 1 includes determining a time delay for the beam to travel through the layer of material.

In Example 3, a thickness of the layer of molding material in the method of Example 2 is determined by the formula:

$$\text{Thickness} = \frac{\text{Time Delay} \times \text{Speed of the beam in vacuum}}{\text{Refractive Index of the molding material}}.$$

In Example 4, the molding material in the method of Example 1 includes a non-conductive material.

In Example 5, the molding material in the method of Example 1 includes a non-conductive polymer material.

In Example 6, the layer of molding material in the method of Example 1 is disposed on a die.

In Example 7, the die in the method of Example 6 is attached to a substrate.

Example 8 is a method including coupling a die to a substrate; dispensing an amount of molding material onto the die; determining a time delay for a terahertz beam emitted at the amount of molding material to travel through the molding material; and determining a thickness of the amount of molding material, wherein determining a thickness is based on the time delay.

In Example 9, the thickness of the layer of molding material in the method of Example 8 is determined by the formula:

$$\text{Thickness} = \text{Time delay} \times \frac{\text{speed of beam in vacuum}}{\text{refractive index of the molding material}}.$$

In Example 10, the molding material of Example 8 includes a non-conductive material.

In Example 11, the molding material in the method of Example 8 includes a non-conductive polymer material.

In Example 12, the molding material in the method of Example 8 embeds the die.

In Example 13, the substrate in the method of Example 8 includes a single unit of a panel of multiple units and further includes singulating the substrate from the panel.

In Example 14, the method of Example 8 further includes comparing the thickness of the amount of molding material to a predetermined threshold.

In Example 15, the method of Example 14, further includes modifying the amount of molding material dispensed onto subsequent dice based on the comparison to the predetermined threshold.

Example 16 is a system including a panel supporter operable to support a panel including a plurality of substrates arranged in a planar array; a light source operable to emit a terahertz beam at a panel on the panel supporter; a detector operable to detect a reflection of a terahertz beam emitted at a panel; and a processor operable to determine a thickness of a material on the panel based on a time delay for an emitted terahertz beam to be detected by the detector.

In Example 17, the processor of the system of Example 16 includes non-transitory machine readable instructions that when executed determine a thickness based on the formula:

$$\text{Thickness} = \text{Time delay} \times \frac{\text{speed of a terahertz beam in vacuum}}{\text{refractive index of the molding material}}.$$

In Example 18, the machine-readable instructions that when executed in the system of Example 17 further includes the method of comparing the determined thickness to a predetermined threshold.

In Example 19, at least one of the light source and the panel supporter of the system of Example 16 are operable to move relative to the other.

In Example 20, the detector of the system of Example 16 is operable to detect waveforms of reflected light from different interfaces.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method comprising:
    emitting a terahertz beam from a light source at a layer of molding material comprising an organic resin on an integrated circuit substrate, wherein terahertz light can penetrate each of the molding material and the substrate producing a first reflectance at an air/molding material interface, a second reflectance at a molding material/substrate interface and a third reflectance from the substrate;
    detecting the second reflectance of the beam with a time delay; and
    determining a thickness of the layer of molding material.

2. The method of claim 1, wherein determining a thickness of the layer of molding material comprises determining a time delay for the beam to travel through the layer of material.

3. The method of claim 2, wherein a thickness of the layer of molding material is determined by the formula:

$$\text{Thickness} = \frac{\text{Time Delay} \times \text{Speed of the beam in vacuum}}{\text{Refractive Index of the molding material}}.$$

4. The method of claim 1, wherein the molding material comprises a non-conductive material.

5. The method of claim 1, wherein the molding material comprises a non-conductive polymer material.

6. The method of claim 1, wherein the layer of molding material is disposed on a die.

7. The method of claim 6, wherein the die is attached to a substrate.

8. A method comprising:
coupling an integrated circuit die to a substrate;
dispensing an amount of molding material comprising an organic resin onto the die;
determining a time delay for a terahertz beam emitted at the amount of molding material to travel through the molding material; and
determining a thickness of the amount of molding material, wherein determining a thickness is based on the time delay.

9. The method of claim 8, wherein the thickness of the layer of molding material is determined by the formula:

$$\text{Thickness} = \text{Time delay} \times \frac{\text{speed of beam in vacuum}}{\text{refractive index of the molding material}}.$$

10. The method of claim 8, wherein the molding material comprises a non-conductive material.

11. The method of claim 8, wherein the molding material comprises a non-conductive polymer material.

12. The method of claim 8, wherein the molding material embeds the die.

13. The method of claim 8, wherein the substrate comprises a single unit of a panel of multiple units, the method further comprising:
singulating the substrate from the panel.

14. The method of claim 8, further comprising:
comparing the thickness of the amount of molding material to a predetermined threshold.

15. The method of claim 14, further comprising:
modifying the amount of molding material dispensed onto subsequent dice based on the comparison to the predetermined threshold.

* * * * *